United States Patent
Thodesen

(10) Patent No.: US 6,745,019 B1
(45) Date of Patent: Jun. 1, 2004

(54) PROCESS AND SYSTEM FOR REDUCING LEAKAGE OF LOCAL OSCILLATOR

(75) Inventor: Yngve Thodesen, Radal (NO)

(73) Assignee: Nera A.S.A., Kokstad (NO)

(*) Notice: Subject to any disclaimer, the term of this patent is extended or adjusted under 35 U.S.C. 154(b) by 0 days.

(21) Appl. No.: 09/504,099

(22) Filed: Feb. 15, 2000

(51) Int. Cl.[7] .............................................. H04B 1/00
(52) U.S. Cl. ...................... 455/302; 455/310; 455/296; 455/323
(58) Field of Search ............................... 455/302, 317, 455/326, 310, 318, 319, 296, 130, 313, 196.1, 150.1, 323, 86, 76, 73

(56) References Cited

U.S. PATENT DOCUMENTS

| | | | |
|---|---|---|---|
| 4,811,425 A | * | 3/1989 | Feerst ......................... 455/317 |
| 4,814,715 A | * | 3/1989 | Kasperkovitz .............. 329/319 |
| 4,817,201 A | * | 3/1989 | Bonato ........................ 455/325 |
| 5,428,837 A | * | 6/1995 | Bayruns et al. ............. 455/317 |
| 5,530,929 A | * | 6/1996 | Lindqvist et al. ........... 455/324 |
| 5,809,409 A | * | 9/1998 | Itoh et al. .................... 455/327 |
| 5,872,537 A | * | 2/1999 | Siweris ........................ 342/128 |
| 5,918,167 A | * | 6/1999 | Tiller et al. ................. 455/310 |
| 6,026,287 A | * | 2/2000 | Puechberty et al. ........ 455/333 |
| 6,343,211 B1 | * | 1/2002 | Thodesen et al. .......... 455/317 |

* cited by examiner

Primary Examiner—Sonny Trinh
(74) Attorney, Agent, or Firm—Francis C. Hand; Carella, Byrne, Bain et al.

(57) ABSTRACT

The present invention relates to a process and a system for reducing leakage of LO to the RF-port (LLO) in a real system that converts the frequency of a first signal, i.e. the LO signal, by mixing the first signal with a second supplied signal SI to a third signal SO of a frequency that is different from the frequency of the first and second signal. More specifically the invention relates to a process and a system that are applied to suppress LLO in real image reject balanced passive mode transistor mixers. Further, the invention also relates to a balanced passive mode transistor mixer and an image reject balanced mixer to be used in said process and system.

30 Claims, 14 Drawing Sheets

PROCESS AND SYSTEM FOR REDUCING LEAKAGE OF LOCAL OSCILLATOR

The present invention relates to a process and a system for reducing leakage of LO to the RF-port (LLO) in a real system that converts the frequency of a first signal, i.e. the LO signal, by mixing the first signal with a second supplied signal SI to a third signal SO of a frequency that is different from the frequency of the first and second signal. More specifically the invention relates to a process and a system that are applied to suppress LLO in real image reject balanced passive mode transistor mixers. Further, the invention also relates to a balanced passive mode transistor mixer and an image reject balanced mixer to be used in said process and system.

In modern radio communication there is used a conversion from a first carrier wave frequency to a second frequency. For this conversion a frequency converter/mixer is employed. If the second signal is the IF and the third signal is the RF, the mixer is called an upconverter. Otherwise, if the second signal is the RF and the third signal is the IF, the mixer is called a downconverter. The mixer may be realised equally for these two modus of the mixer. This is the case for the kind of mixer discussed herein. For the upconverter, the IF is supplied and the RF is produced, while for the downconverter the RF is supplied and the IF is produced. In the following description, the upconverter configuration is used, but the present invention is not restricted to this embodiment.

Ideally the mixer functions so that it receives the signal which is to be converted—IF—and a local oscillator signal—LO—and emits only one signal—RF—which has a frequency equal to the sum or the difference of the frequencies for IF and LO. However, practical limitations cause several other undesired signals also to be present together with RF. A so-called "image"—IM—will be present (both "the sum signal" and "the difference signal" will come to the RF-gate—the one is desired, while the other is IM and consequently undesired). LO will leak out to the RF-port (Even if the mixer is used as a downconverter, the LLO is the LO leaking to the RF-port) In addition a series of other undesired signals named spurious signals, will arise in the mixer. The important ones can be made small and insignificant by employing as far as possible a linear mixing element and by allowing LO to be strong and dominating relative to IF and RF. The level of leaked LO—LLO—is proportional to the level of the supplied LO—SLO. The two dominating spurious signals will therefore be IM and LLO.

The prior art describes some approaches for reducing the LLO. A short review of these approaches is given in U.S. Pat. No. 6,343,211, as incorporated herein by reference.

U.S. Pat. No. 6,343,211 also describes a system and a process where two balanced mixers are combined in an image reject mixer configuration. The varying LOL from each of the balanced mixers are 90 degrees out of phase, and these two leakages (named LOL1 and LOL2 in the indicated application) are added before the RF-port, and the resulting leakage will be cancelled.

Applicants U.S. patent application Ser. No. 09/218,880 also describes a system and a process where two balanced mixers are combined in a image reject mixer configuration. The varying LOL from each of the balanced mixers are 90 degrees out of phase, and these two leakages (named LOL1 and LOL2 in the indicated application) are added before the RF-port, and the resulting leakage will be cancelled.

Yngve Thodesen, A resistive HEMT image reject upconverter with tunable LO supression. $30^{th}$ ARMMS Conference Digest, 1999 describes two related approaches. The first approach, also disclosed in U.S. patent application Ser. No. 09/218,880, is a resitive HEMT mixer with no drain bias, and is cold. A gate bias Vg is usually applied. The LO is supplied to the gate, while the IF and RF exist at the drain. The LOL then depends on how the LO leaks through the HEMT This application is easy to implement and suitable for MMIC design. However, it is not very robust.

The first approach is limited by the fact that the LO-power needed to drive the mixer element into a welbehaved modus simultaneously limits the dynamic in the regulations. The approach to this problem is to get parameters usable for the regulation that are not overlapping the ones used to control performance. These new parameters are provided by four PIN-diodes. This second approach is more robust, but the four PIN diodes make the solution expensive and not suitable for MMIC design.

The aim of the present invention is thus to develop a solution that combines robustness, simplicity and MMIC compatibility.

The purpose of the present invention is to minimise the limitations of prior art solutions and systems, by providing a process, system and mixers where passive mode transistors are utilised in mixers, and where these are arranged together with reflecting elements so that the unwanted LLO is reduced considerably. The system and the process according to the present invention can thus be employed where limitations in the components produce non-ideal conditions.

In accordance with the present invention there is provided a process for reducing leakage of LO in a non-ideal system that converts the frequency of a first signal, i.e. the LO signal, by mixing the first signal with a second supplied signal SI to a third signal SO of a frequency that is different from the frequency of the first and second signal, wherein the first signal is divided via a number of couplers into a number of part-signals, preferably 4, which are phase-displaced relative to each other, and that each such part-signal is led to its respective transistor there being partly absorbed, partly leaking through and partly reflected, and that the part being absorbed by each transistor are mixed with the second signal SI and frequency-shifted, and that the reflected signal from each transistor, while being adjusted by some regulating means, are transferred back to each transistor where a part of it is leaking through, and that the frequency-shifted part-signals are added to a third signal via a number of couplers after the signals are phase-displaced relative to each other, and that the regulating means being adjusted so that the LO-leakage signal caused by the reflection and the regulating means is cancelling the direct LO-leakage signal so that the total LO-leakage is reduced.

A preferred embodiment of the present invention relates to a process, wherein the IF-lines are arranged so that none of these crosses, wherein the signals from the two couplers are fed to the respective decoupling capacitors to make possible for the two outer filters to be placed in the same branches as the two inner filters respectively, so that an IF-structure with couplers may be placed together inside the mixer, while being connected to the outside of the mixer through filters, while utilising couplers that do not attenuate the IF-signal, and that a decoupling capacitor is placed after the last coupler to isolate the IF-signal from leaking to the RF-port.

Further, the invention also relates to a system for reducing the leakage of LO in a non-ideal system that converts the frequency of a first signal by mixing the first signal with a second supplied signal SI to a third signal SO of a frequency that is different from the frequency for the first and second signal, wherein the system comprises:

coupler means wherein the first signal is divided into a number of part-signals, preferably 4, which are phase-displaced relative to each other, and transistor means whereto each signal is fed, there being partly absorbed, partly leaking through and partly reflected, and that the part being absorbed by each transistor are mixed with the second signal SI and frequency-shifted, and regulation means wherein the reflected signal from each transistor being adjusted and transferred back to each transistor where a part of it is leaking through, and coupler means wherein the frequency-shifted part-signals are added to a third signal, after the signals are phase-displaced relative to each other, and that the regulating means being adjusted so that the LO-leakage signal caused by the reflection and the regulating means is cancelling the direct LO-leakage signal so that the total LO-leakage is reduced.

A preferred embodiment of this system is characterized in that the IF-lines are arranged so that none of these crosses, wherein decoupling capacitors are placed after the couplers to make possible for the two outer filters to be placed in the same branches as the two inner filters respectively, so that an IF-structure with couplers may be placed together inside the mixer, while being connected to the outside mixer through filters, while utilising couplers that do not attenuate the IF-signal, and that a decoupling capacitor is placed after the last coupler to isolate the IF-signal from leaking to the RF-port.

Further, the invention also relates to a balanced passive mode transistor mixer and an image reject balanced mixer.

Further, the invention also relates to a balanced passive mode transistor mixer employing a PIN-diode or a drain-side of a passive mode transistor as a tunable reflecting load and an image reject balanced mixer wherein the couplers are 90° couplers preferred embodiments of the invention are given in the subclaims 2–12, 14–21, 23 and The invention will now be further explained with reference to the accompanying figures and claims, wherein:

Figure 3:
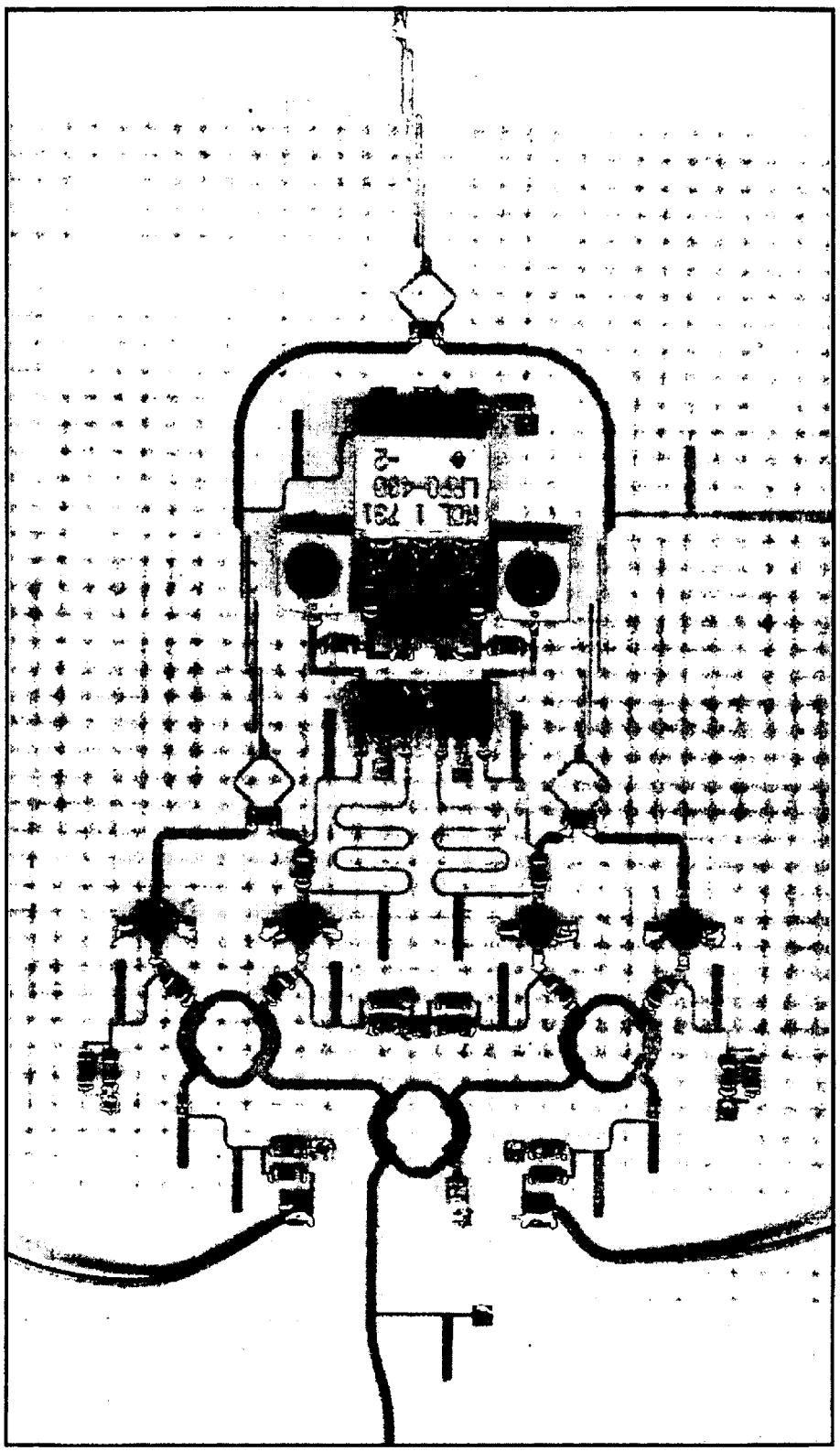
FIG. 3 shows a preferred embodiment of the present invention that prevents crossing I.F.-lines.

Table 1 shows measured performance of the mixer shown in FIG. 3.

In the FIGS. 1–11 the coupling points (terminals) are indicated as —O—. In order to make the Figures surveyable, we have chosen not to insert reference numerals at all these coupling points.

The following abbreviations are employed:

| | |
|---|---|
| IF | Intermediate frequency |
| SIF | Supplied IF |
| LIF | Leaked IF |
| RF | Radio frequency |
| LO | Local oscillator |
| SLO | Supplied LO |
| LLO | Leaked LO |
| ALO | Adjusted LO |
| DLO | Direct LO-leakage |
| ILO | Indirect LO-leakage caused by reflecting loads |
| RLO | Reflected LO (from the input of the transistor) |
| ARLO | Adjusted Reflected LO |

Figure 1A:
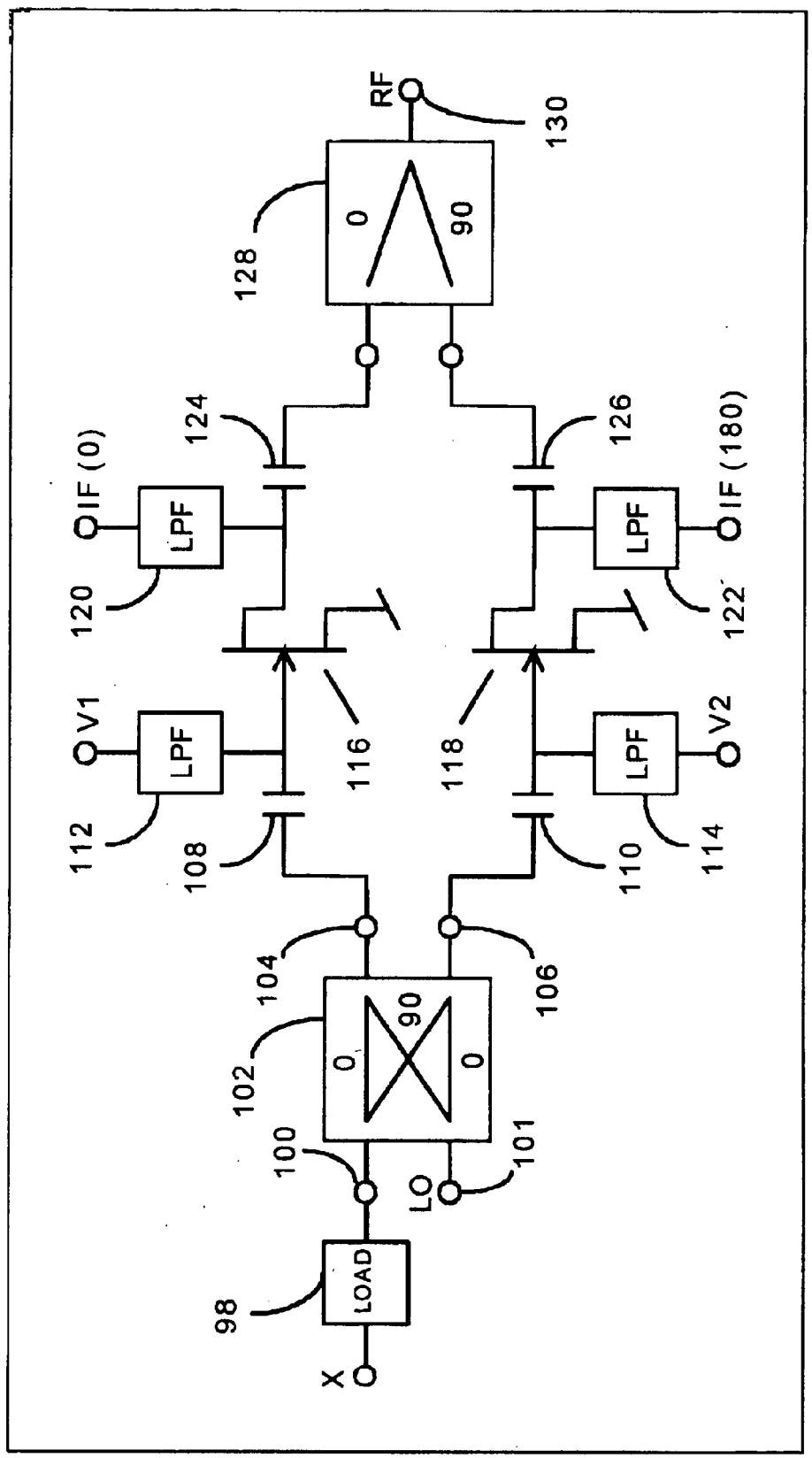
FIGS. 1a and 1b show a balanced passive mode transistor mixer according to the present invention.

FIG. 1a shows a modified version of a balanced passive mode transistor mixer 90. In this circuit, 90° couplers 102 and 128 are applied. Mixers with this configuration have quite good input and output reflection-loss (reflection-coefficients $S_{11}$ and $S_{22}$ close to zero). The reason is that most of the two LO-signal parts reflected from the transistor-inputs and the two RF-signal parts reflected from the transistor-outputs are terminated in the terminations coupled to or included in the 90° couplers 102 and 128, respectively (K. W. Chang, et al, "High Performance Resistive EHF Mixers Using InGaAs HEMTs", 1992 IEEE MTT-S Digest, pp. 1409–1412). In FIG. 1a a specific 90° coupler is chosen as the LO-coupler 102. This coupler has two ports 101,100 at the input and two ports 104,106 at the output. To form a 90° coupler one of the ports at the input is used as the input-port, i.e. 101, while the other is terminated, i.e. 100. If the two transistors 116 and 118 at the output of the coupler 102 are quite similar, most of the two LO-signal parts reflected from the two inputs will be added in phase at the terminated port 100, and nearly nothing will reflect back to the input-port 101. For more details, see Rajesh Mongia, RF and Microwave Coupled-Line Circuits, Artech House, 1999. In the process and system according to the present invention, a tunable reflecting load 98 is applied instead of the usual termination. This may be a PIN-diode, the drain-side of a passive mode transistor or another tunable load. By making the load higher than the system impedance, a part of the inserted signal is reflected back against the inputs of the transistors with a zero change in phase; by making it lower, a 180° phase-shifted signal is reflected. The level of this reflected signal is dependent on how far the load is regulated from the system impedance (see FIG. 4).

One portion of an inserted LO-signal will always leak through a mixer. In the present invention, this part may be viewed as the sum of two signals: one signal directly related to the LO-input at 101, that is DLO, and another related to the reflected signal from the adjustable load 98, that is ILO. The sum of these two signals, LLO, will exist at the RF-port 130. There is one major difference in the way the two signals are handled by the balanced circuit: DLO is suppressed by the balanced circuit (B dB), while ILO is not. However, ILO is dependent on the reflection-loss at the inputs of the transistors (R dB) and at the load (Dn dB). This will now be described in more detail.

The LO-signal is fed to the input-port 101 of the coupler 102 and divided into two parts with a phase displacement of 90° before being fed to the transistors 116 and 118. Some of these signals leak through the transistors 116,118 and are added in a coupler 128 with a phase displacement of 90°. A total phase displacement of 180° (90°+90°) implies that this signal, the DLO, is suppressed by the balanced circuit. The reflected signal from the tunable load is fed to the usually terminated port 100 of the coupler 102 and divided in two with a phase displacement of −90° before fed to the transistors 116,118. Some of these signals leak through the transistors 116,118 and are added in a coupler 128 with a phase displacement of 90°. A total phase displacement of 0° (−90°+90°) implies that this signal, the ILO, is not suppressed by the balanced circuit. The difference in dB between the |ILO| and the |DLO| is described by eq. 1.

$$|ILO| - |DLO| = B - R - Dn \vee n = \begin{cases} 1 \\ 2 \end{cases} \quad \text{Eq. 1}$$

R and Dn are the decibel-value (dB) of the return-lose at the inputs of the transistors 116, 118 and at the load 98, respectively. B is the decibel-value of the suppression of the DLO caused by the balancing-technique.

Figure 1B:
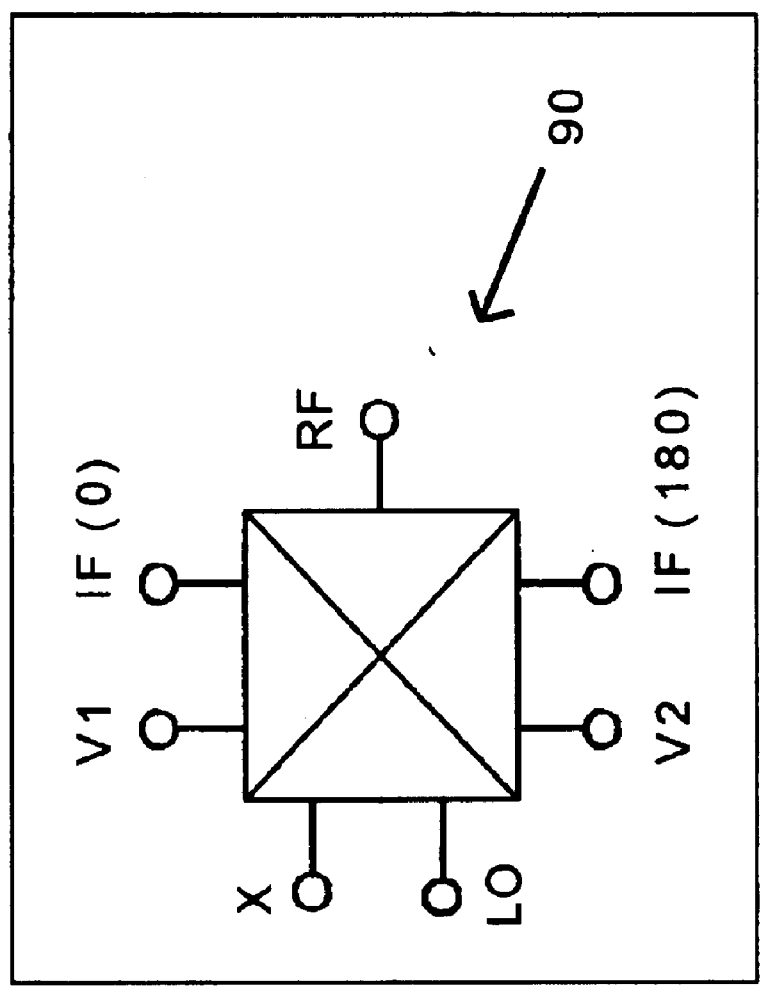

FIG. 1b shows a symbol of the mixer 90 shown in FIG. 1a.

If the mixer 90 in FIG. 1 had been ideal, the DLO would have been zero. Then there would have been no need for ILO, which of course had to be made zero by adjusting the load equal to the system-impedance, which implies that it function as a termination. This corresponds to the point of origin in the phase-diagram given in FIG. 5. Since the mixer is not ideal, the DLO is not zero and may be displayed as a vector in the phase-diagram, where the distance from the origin determines the amplitude, and the direction from the origin determines the phase.

Figure 2A:
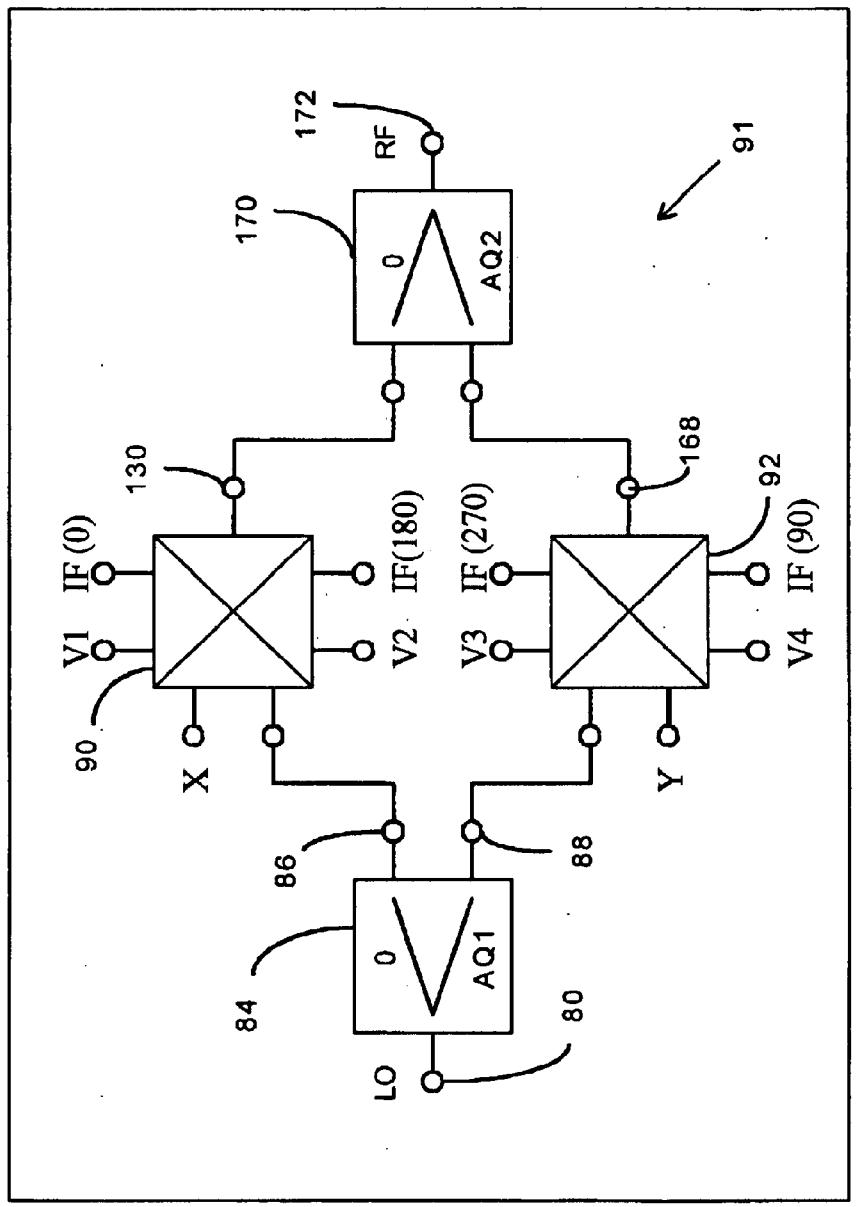
FIG. 2a shows with symbols an embodiment of a system according to the present invention where there are utilised two passive mode transistor mixers of the type as illustrated in FIG. 1b coupled together in an image reject coupling.
Figure 2B:
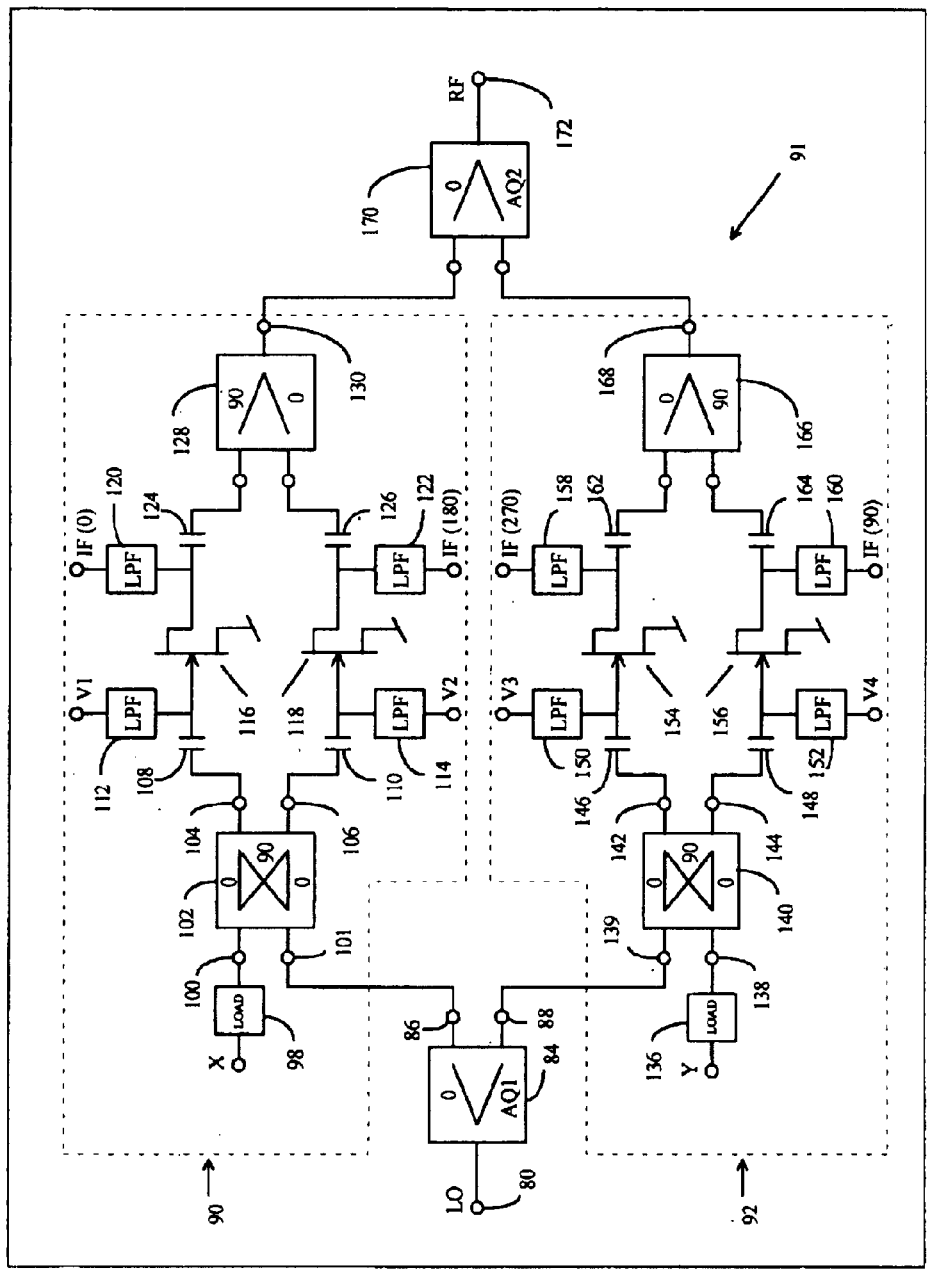
FIG. 2b shows a construction of a system according to the present invention where there are utilised two passive mode transistor mixers of the type as illustrated in FIG. 1a coupled together in an image reject coupling.

The present invention aims at mounting two mixers of the type shown in FIG. 1 in an image reject coupling. For the embodiments that are shown in FIGS. 2a and 2b, the first signal is an LO-signal, the second signal an IF-signal and the third signal an RF-signal. 2a and 2b illustrate how the LO-signal is divided into two equal portions, i.e. $SLO_a$ and $SLO_b$ (see FIGS. 10 and 11). In the most preferred embodiment these signals are phase-displaced AQ1 (0° to 90°) relative to each other in a coupler 84 in the mixer 91. $SLO_a$ and $SLO_b$ are led out through terminals 86 and 88, respectively, and fed to each of its mixers, 90 and 92 respectively. The signal that is led out through terminal 86 is further divided in coupler 102 in the mixer 90 into two portions $SLO_{a1}$ and $SLO_{a2}$ that in the most preferred embodiment are phase-displaced about 90° relative to each other, and the signals are led out through the terminals 104 and 106, respectively. The signal that comes from the terminal 104 is led to a transistor 116 where $SLO_{a1}$ is mixed with IF(0), which is fed through the low pass filter 120, and the signal that comes from terminal 106 is led to a transistor 118 where $SLO_{a2}$ is mixed with IF(180), which is fed through the low pass filter 122. $V_1$ and $V_2$ can be set to a value optimised for best performance of the mixer 90. The signals are added in the coupler 128, after they are, in the most preferred embodiment, phase-displaced about 90° relative to each other, and are led out through the terminal 130. The RF and IM signals are each added in phase. A part of $SLO_{a1}$ will leak through the transistor 116, that is $DLO_{a1}$, and a part, i.e. $RLO_{a1}$, of $SLO_{a1}$ will be reflected back against the coupler 102. Likewise, a part of $SLO_{a2}$ will leak through the transistor 118, that is $DLO_{a2}$, and a part, i.e. $RLO_{a2}$, of $SLO_{a2}$ will be reflected back against the coupler 102. $DLO_{a1}$ and $DLO_{a2}$ are added in the coupler 128, after being phase-displaced relative to each other, preferably by 90°. The result is that $DLO_{a1}$ and $DLO_{a2}$ are added out of phase and a suppressed $DLO_a$ is led out through the terminal 130. The two reflected signals are quite similar in amplitude, and phase-displaced 90° relative to each other. Therefore most of these signals will add ($RLO_{a1}+RLO_{a2}=RLO_a$) to be transferred to port 100. Usually this port is terminated, but in the present invention a tunable load 98 is mounted to port 100. Dependent on the size of the load, a part of the reflected LO-signal $RLO_a$ is reflected back against the transistors. The level of this adjusted signal (ARLO) is dependent on how far the load is from the system-impedance, and the phase of this ARLO signal is changed 0° or 180° dependent on the load being larger or lower than the system impedance, respectively. The ARLO signal is divided in coupler 102 in the mixer 90 into two portions that are phase-displaced −90° relative to each other, and the signals are led out through the terminals 104 and 106. The signal, which comes from the terminal 104, is led to a transistor 116 where a part leaks through, i.e. $ILO_{a1}$. The signal, which comes from the terminal 106, is led to a transistor 118 where a part leaks through, i.e. $ILO_{a2}$. The signals are added in the coupler 128, after they are phase-displaced 90° relative to each other. Therefore $ILO_{a1}$ and $ILO_{a2}$ are added in phase, and the $ILO_a$ that is not suppressed by the balancing technique is led out through the terminal 130.

Correspondingly, the signal that is led out through terminal 88 is further divided in coupler 140 in the mixer 92 into two portions $SLO_{b1}$ and $SLO_{b2}$ that in the most preferred embodiment are phase-displaced about 90° relative to each other, and the signals are led out through the terminals 142 and 144. The signal that comes from the terminal 144 is led to a transistor 156 where $SLO_{b1}$ is mixed with IF(90), which is fed through the low pass filter 160, and the signal that comes from terminal 142 is led to a transistor 154 where $SLO_{b2}$ is mixed with IF(270) which is fed through the low pass filter 158. $V_3$ and $V_4$ can be set to a value optimised for best performance of the mixer 92. The signals are added in the coupler 166, after they are in the most preferred embodiment phase-displaced about 90° relative to each other, and are led out through the terminal 168. The RF- and IM-signals are each added in phase. A part of $SLO_{b1}$ will leak through the transistor 156, that is $DLO_{b1}$, and a part, i.e. $RLO_{b1}$, of $SLO_{b1}$ will be reflected back against the coupler 140. Likewise, a part of $SLO_{b2}$ will leak through the transistor 154, that is $DLO_{b2}$, and a part, i.e. $RLO_{b2}$, of $SLO_{b2}$ will be reflected back against the coupler 140. $DLO_{b1}$ and $DLO_{b2}$ are added in the coupler 166, after they are, in the most preferred embodiment, phase-displaced 90° relative to each other. The result is that $DLO_{b1}$ and $DLO_{b2}$ are added out of phase and a suppressed $DLO_b$ is led out through the terminal 168. The two reflected signals are quite similar in amplitude, and phase-displaced 90° relative to each other. Therefore most of these signals will add ($RLO_{b1}+RLO_{b2}=RLO_b$) to be transferred to port 138. Usually this port is terminated, but in the method according to the present invention a tunable load 136 is mounted to input 138. Dependent on the size of the load, a part of the reflected LO-signal $RLO_a$ is reflected back against the transistors. The level of this adjusted signal (ARLO) is dependent on how far the load is from the system-impedance, and the phase of this ARLO signal is changed 0° or 180° dependent on the load being larger or lower than the system impedance, respectively. This signal is divided in coupler 140 in the mixer 92 into two portions phase-displaced −90° relative to each other, and the signals are led out through the terminals 142 and 144. The signal that comes from the terminal 144 is led to a transistor 156 where a part leaks through, i.e. $ILO_{b1}$. The signal that comes from the terminal 142 is led to a transistor 154 where a part leaks through, i.e. $ILO_{b2}$. The signals are added in the coupler 166, after they are phase-displaced 90° relative to each other. Therefore $ILO_{b1}$ and $ILO_{b2}$ are added in phase, and the $ILO_b$ that is not suppressed by the balancing technique is led out through the terminal 168.

The favourable features obtained by the system and process according to the present invention are that a circuit may operate at the same time both as an image reject mixer, which is capable of suppressing IM, and as a phase-shifter, which is capable of suppressing LLO by adjustment. The LLO is reduced to approximately equal 0 (or the origin in FIG. 5) by correct adjustment of parameters X and Y used to control the "phase-shifter". These parameters usually are electrical signals.

Figure 5:
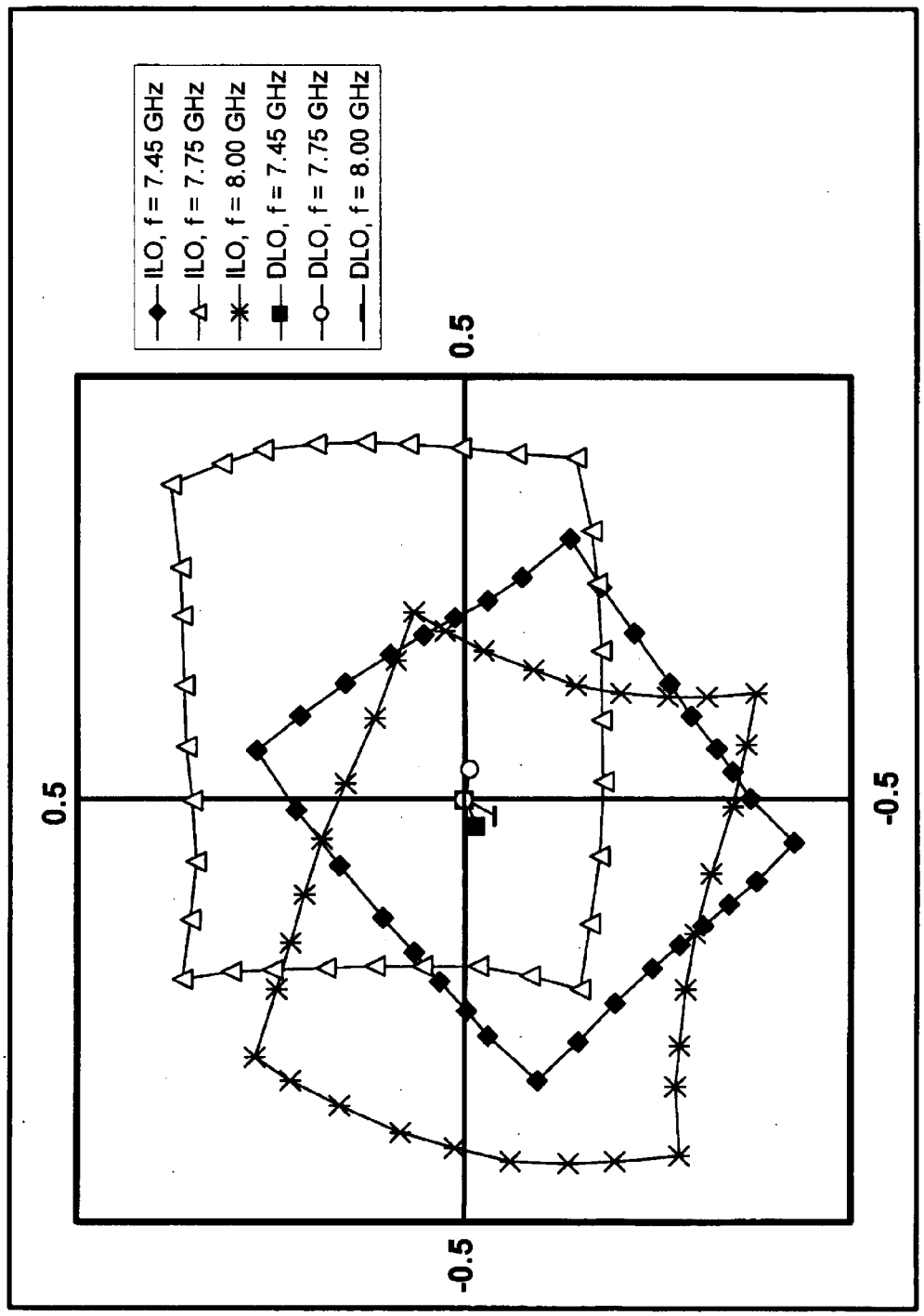
FIG. 5 shows the DLO from the mixer shown in FIG. 3 together with the limits of the ILO from the "phase-shifter" implemented in the same circuit, all displayed in a phase-diagram.

The SLO, fed to the LO-input 80, is in the coupler 84 split into two parts, $SLO_a$ and $SLO_b$, that are phase-displaced AQ1 compared to each other. Some part of them leaks through each balanced mixers 90 and 92, respectively, that is $DLO_a$ and $DLO_b$, before they are phase-displaced AQ2 compared to each other and added in coupler 170. It is most preferred that AQ1+AQ2=90°, which implies that the IM is suppressed, but also that $DLO_a$ and $DLO_b$ is phase-displaced 90° compared to each other before they are added in coupler 170. This implies that also $ILO_a$ and $ILO_b$ are phase-displaced 90° in relation to each other. $ILO_a$ and $ILO_b$ may each be adjusted between $+ILO_{m1}$ and $-ILO_{m2}$, where $ILO_{m1}$ is the maximum limit for 0° phase-shift in the loads and $ILO_{m2}$ is the maximum limit for 180° phase-shift. These limits are shown in FIG. 5, measured for the realised device shown in FIG. 3. The result is that the present invention may operate as an image reject balanced mixer and as a phase-shifter at the same time. The phase of DLO is, however, unpredictable, which implies that $DLO_a$ and $DLO_b$ may add to a signal with a phase that equals the phase of $ILO_a$ or $ILO_b$. Then the other must be adjusted to zero, which implies that $ILO_{m1}$ and $ILO_{m2}$ have to be at least 3 dB larger than the level of $DLO_a$ (and $DLO_b$) to ensure that ILO is capable of phasing out DLO. This implies that eq. 2 has to be fulfilled.

$$Dn \leq B - R - 3 \vee PDn = \begin{cases} 0° \\ 180° \end{cases} \vee n = \begin{cases} 1 \\ 2 \end{cases} \quad \text{Eq. 2}$$

PDn is the phase of Dn, which may be 0° or 180°. If R=2 and B=15, the return-loss of the load has to be tunable down to 10 dB for each phase (0° or 180°). If the inputs of the passive mode mixers are matched to be 10 dB, the load has to be tunable down to 2 dB. Making the balance better, say 20 dB, the diodes only need to reach 7 dB.

The adjusting of the ILO may imply that the return-losses at the LO-input ports 86 and 88 of the balanced mixers 90 and 92 are degraded. If the couplers 102 and 140 were ideal, the balanced mixers 90 and 92 would have return-losses $|S_{11}|_1$ and $|S_{11}|_2$ at the LO-input ports 101 and 139, respectively, given by eq. 3.

$$|S_{11}|_n = 2R + Dn \vee n = \begin{cases} 1 \\ 2 \end{cases} \quad \text{Eq. 3}$$

When the LO-tuning is activated, eq. 4 is fulfilled.

$$Dn \geq B - R - 3 \vee n = \begin{cases} 1 \\ 2 \end{cases} \quad \text{Eq. 4}$$

This implies that the return-loss at the input 101, 139 of the balanced mixers 90, 92 is given by eq. 5.

$$|S_{11}|_n \geq R + B - 3 \vee n = \begin{cases} 1 \\ 2 \end{cases} \quad \text{Eq. 5}$$

If R=2 and B=15, the return-loss at the LO-port of the balanced mixer would be better than 14 dB. The return-loss might be a little degraded by real couplers, however, if AQ1 is set to 90° in the coupler 84, there will be a certain improvement, and the return-loss of the LO-port 80 of the total mixer will then probably be described well enough by eq. 5. The return-loss at the output 172 should be very little affected by the adjustments.

In comparison with the known prior art solutions the following advantages are obtained with the present invention;

1. The method and the system are robust and ensure that LLO is sufficiently suppressed it X and Y are adjusted to correct values.
2. The method and the system are not dependent upon a extern phase shifter. The same circuit that suppresses IM also suppresses LLO.
3. The method and the system are independent upon the power of TLO, which imply that this power may be set to a level optimised for best performance of the mixer.
4. A passive transistor mixer is much more linear than a diode mixer.

With the novel method a very linear mixer with negligible LLO can be obtained.

Best Mode

Below is described, a presently most preferred embodiment of the present invention that is specifically developed for reducing the costs of production, avoiding undesired resonance effects, and together providing a relative good balance in the mixer. This solution comprises a circuit solution that avoids crossing IF lines, as shown in FIG. 3. The adjustable loads are realised as PIN-diodes 98' and 136', together with virtual grounds 94' and 132', where dc-currents may be connected through low-pass filters 96' and 134', respectively. The dc-currents are looped through each coupler 102' and 140', respectively, and through a common coupler 84' and low-pass filter 82' to dc-ground. The parameters X and Y applied by the "phase-shifter" are realised as do voltages Vd1 and Vd2, which control the diode-currents.

Decoupling capacitors, which are arranged in order to prevent the signals from flowing between the terminals of the couplers and thus leaking away or short-circuiting each other, are moved in order to achieve the aforementioned advantages. The coupler 84' is chosen to have AQ1=90°, while the coupler 170' is chosen to have AQ2=0°. The couplers 128', 166' and 170' may easily be designed to have isolation between the adding-ports at the LO-frequency, but not at the IF-frequency. Thus the IF-signals will each reach their respective transistors without loosing the balance in level. The desired phase difference between the four IF-signals is maintained by taking care that the physical distances for the signals are equal. This is not shown in FIG. 3.

In FIG. 2b the IF structure with 180° and 90° couplings are not shown. In the solution of FIG. 3 this is included in order to show clearly a complete realisation.

FIG. 3 thus shows a system where transistors are utilised in the passive mode. The explanation of the Figure is as for FIG. 2b, but with the difference and clear advantage that the connections for IF are on the outside of the circuit and no lines cross each other as they are obliged to do in the solution of FIG. 2b when the IF structure is included. The Lo-signal is divided into two equal portions in a coupler 84' that most preferably are phase-displaced about 90° relative to each other. The one portion of the signal is further divided into two signals via coupler 102', most preferably mutually phase-displaced about 90°, before the two signals are led out through the terminals 104' and 106'. The decoupling capacitors 108' and 110' separate the two input-biases V1 and V2 from each other and the coupler 102'. After the transistors the decoupling capacitor 126' separates the connections for the two IF-signals, which now are arranged the same transistor branch. The decoupling capacitor 124' now separates IF(O) from leaking to the RF-output.

Correspondingly for the portion of the signal that is led from coupling 84' via terminal 88' to the coupler 140', the signal is further divided into two portions, most preferably mutually phase-displaced about 90°, before the two signals are led through the terminals 142' and 144'. The decoupling capacitors 146' and 148' separate the two input-biases $V_3$ and $V_4$ from each other and the coupler 140'. After the transistors, the decoupling capacitor 162' separates the connections for the two IF-signals, which are now arranged on the same transistor branch. The decoupling capacitor 164' now separates IF(90) from leaking to the RF-output.

In accordance with this most preferred embodiment of the invention, all the IF-signals are met on the inside of the mixer structure, and the IF-structure can be arranged there. This is done with two couplers 121' and 159', most preferable 180°, and a coupler 123', most preferable 90°. Choosing AQ3=90°, the upper sideband is chosen as the RF; choosing AQ3=–90°, the lower sideband will be the RF. In order to feed the IF-signal into the IF-structure, two low-pass filters 163' and 125' are employed together with the fact that the coupler 170' easily may be designed to not isolate at the IF-frequency. The result is that the IF-structure does not affect the balance in the image reject coupling. The IF-signal is thus fed at terminal 169', is fed to the RF-line via low-pass filter 125', is led unimpeded through coupler 170' and low-pass filter 163', then divided into two equal portions in a coupler 123' that are most preferably phase-displaced about ±90° relative to each other, before led further to coupler 121' and 159', where the signals are split to IF(0), IF(180), IF(90) and IF(270). The phases of these are most preferable about 0°, 180°, 90°, 270°, respectively. It clearly emerges from FIG. 2c that no IF-crossings are necessary.

A mixer based on the present invention includes four packaged HEMTs—NE325S01—as the mixing-elements. The couplers 84', 102' and 140' are realised as branch-couplers, while the couplers 128', 166' and 170' are realised as Wilkerson-couplers. The 90° phase displacement in couplers 128' and 166', are realised as differences in physical length of the RF-lines coupled to the Wilkerson-hybrids. To avoid crossing lines, a Wilk-hybrid with negligible isolation for the IF-frequency is utilised. In this way, most of the IF-network may be concentrated in the middle of the mixer, producing a very compact, easily producible and reliable circuit. The decoupling capacitors 124', 164' and 171' are changed to be realised as coupled microstrip filters. These give a better isolation for the IF-signal than the small decoupling capacitors utilised for 108', 110', 146', 148', 126' and 162', but are physically larger. However, this is utilised for naturally displacing the IF-connections further out. Various undesired reflections in the IF-structure can thus be avoided. Couplers in the IF structure are diversely packed circuit elements. A variable resistance plus two variable capacitors have also been used in order to tune phase-difference and amplitude balance in the four internal IF connections. An adjustment of the suppression of IM is now possible. Two packaged PIN-diodes—MPP4203-MMSM—are applied, which implies that the mixer may be mounted by an automatic ensemble (pick and place).

Figure 4:
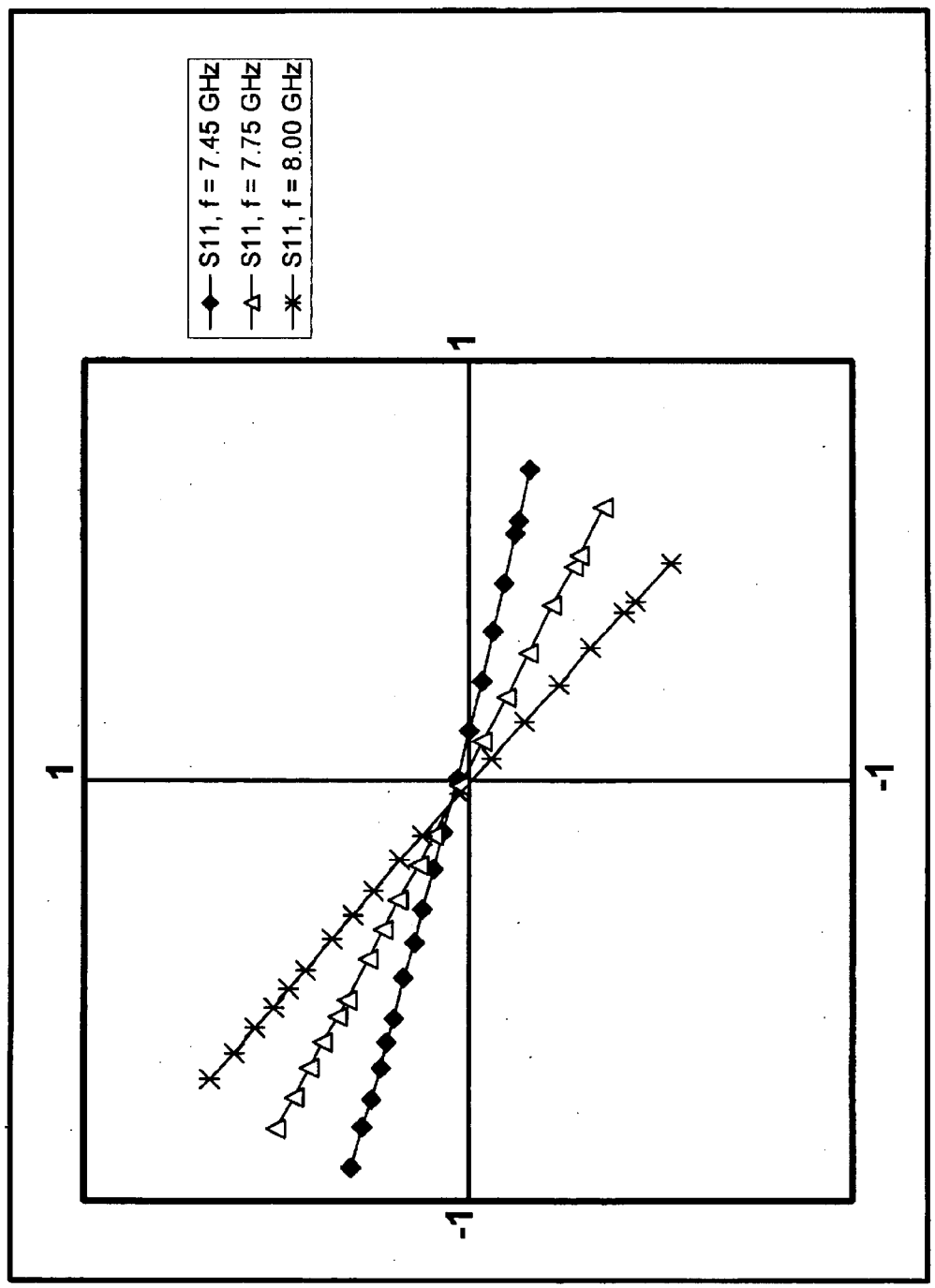
FIG. 4 shows the reflection-coefficient $S_{11}$ at the PIN-diode in a phase-diagram.

FIG. 4 shows the reflection-coefficient $S_{11}$ at one of the PIN-diodes in a linear phase-diagram. The diode-current is swept between 0 and 3 mA, being 0.23 mA where the $S_{11}$ is closest to 0 (the return-loss is highest).

In FIG. 5, the DLO at three frequencies in a chosen frequency-band—the lowest, the middle and the highest—are shown. In the same diagram, the limits of the ILO from the "phase-shifter" are shown for the same frequencies, when the diode-currents are limited to between 0 and 1.4 mA. The LO-power is 15 dBm. It has been verified that the novel method in accordance with the present invention is quite independent of the LO-power.

Figure 6:
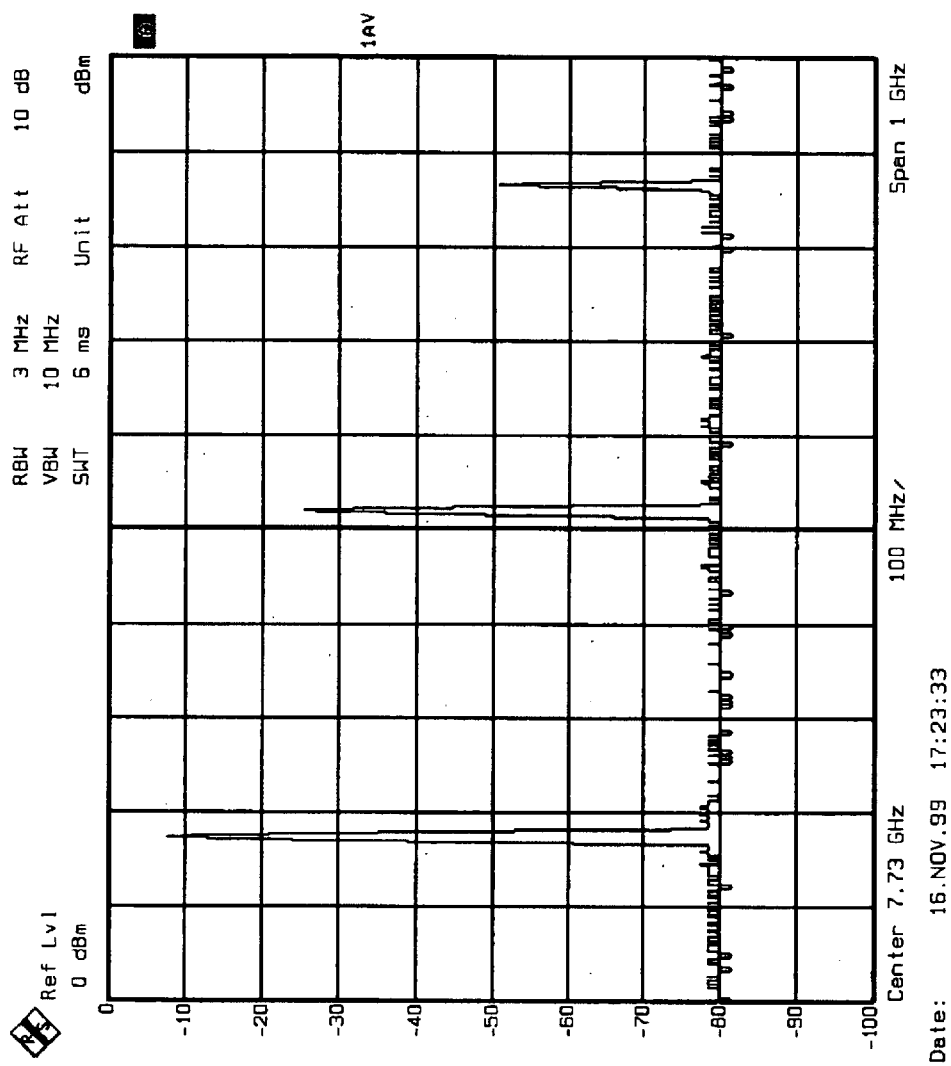
FIG. 6 shows measured values for the mixer shown in FIG. 3 without the use of the "phase-shifter".
Figure 7:
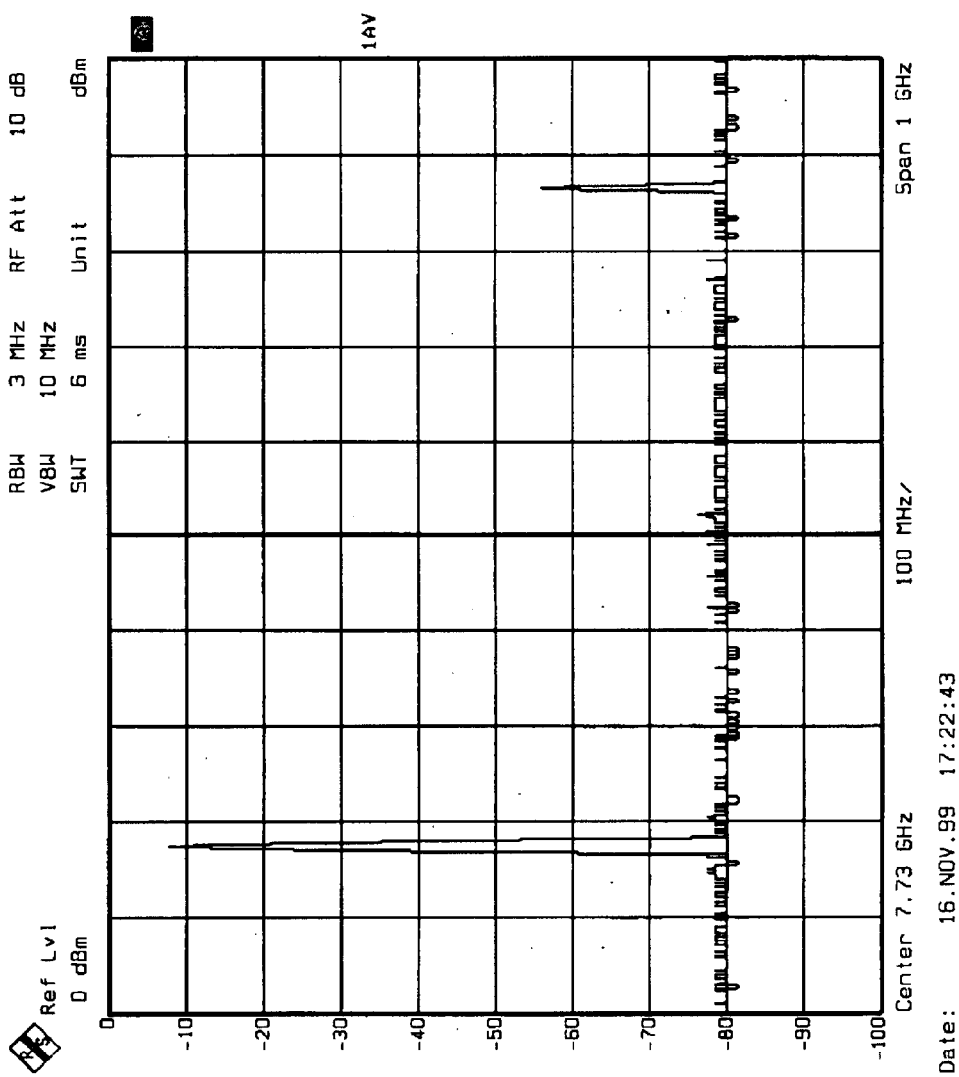
FIG. 7 shows measured values for the mixer shown in FIG. 3 with the "phase-shifter" activated to phase out the DLO.

FIGS. 6 and 7 show the RF, LLO and IM for the mixer in FIG. 3, given in an xy-diagram, where the x-axes is the frequency in GHz and the y-axes is the amplitude in dBm. In FIG. 6 the "phase-shifter" is not activated; in FIG. 7 it is.

Figure 8:
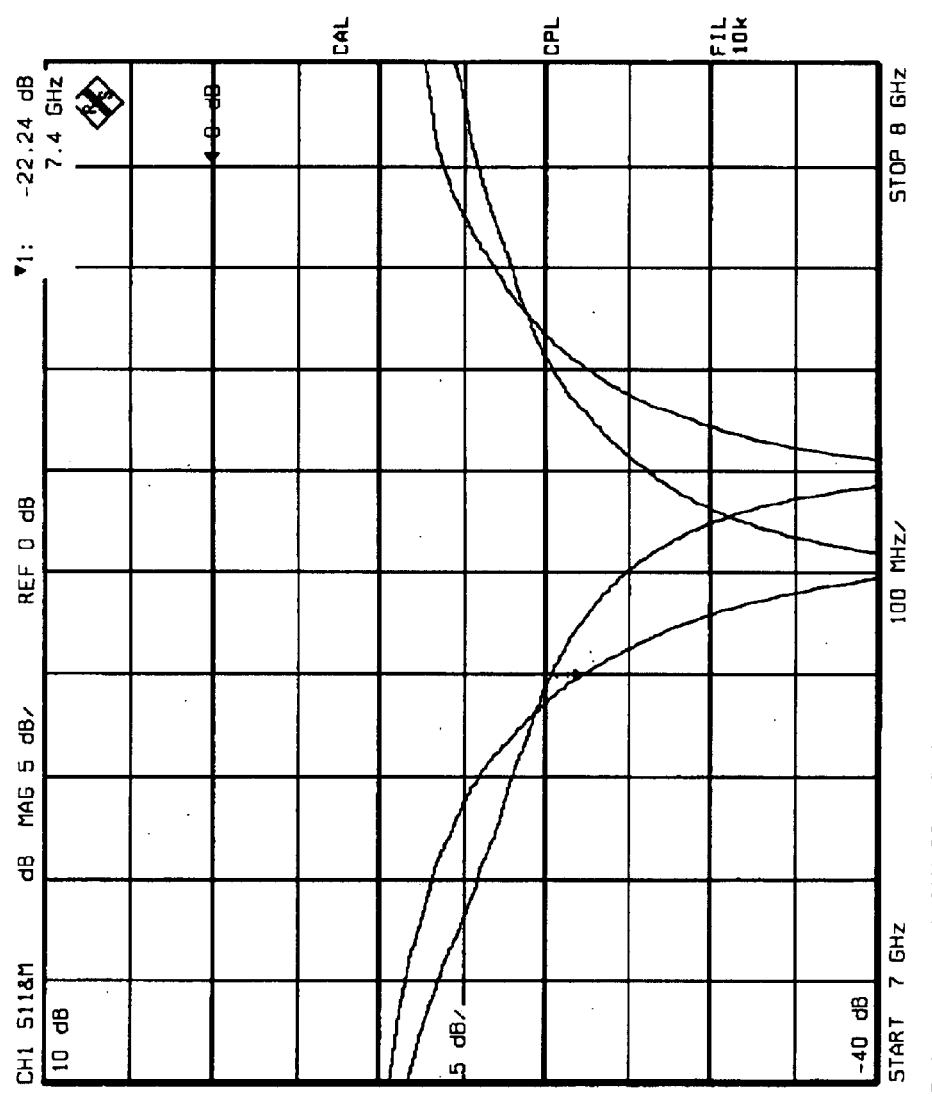
FIG. 8 shows the reflection coefficient $S_{11}$ at the LO-input.

FIG. 8 shows the normal and the worst-case reflection-coefficient $S_{11}$ at the LO-input of the mixer in FIG. 3, when the "phase-shifter" is not activated and when it is activated, respectively. The return-loss at the LO-input is measured to be at least 13 dB in the selected frequency-band for all adjustments in table 1. In fact, the return-loss would for this example always be much better because the frequency for the worst return-loss always was on a different frequency than the frequency applied.

Figure 9:
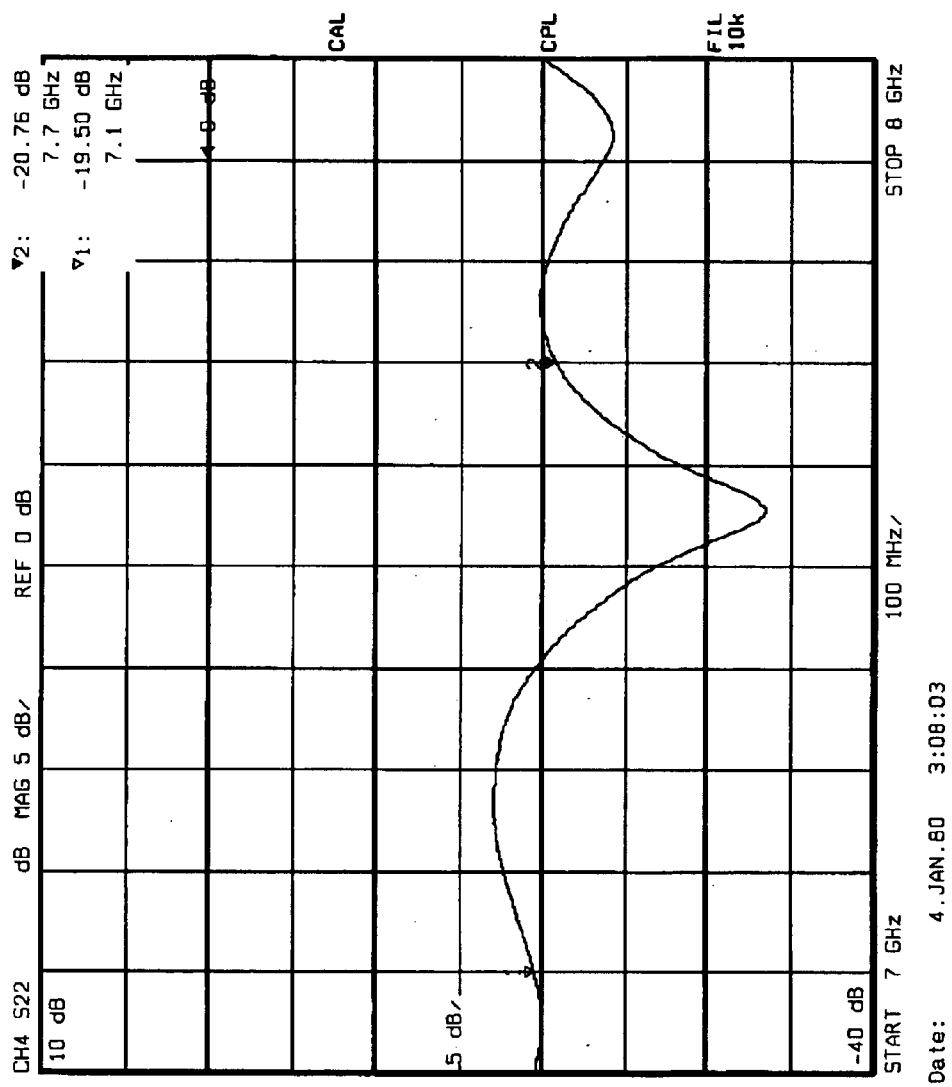
FIG. 9 shows the reflection coefficient $S_{22}$ at the RF-output.

FIG. 9 shows the reflection-coefficient $S_{22}$ at the RF-output of the mixer in FIG. 3. The return-loss at the output was better than 17 dB.

Figure 10:
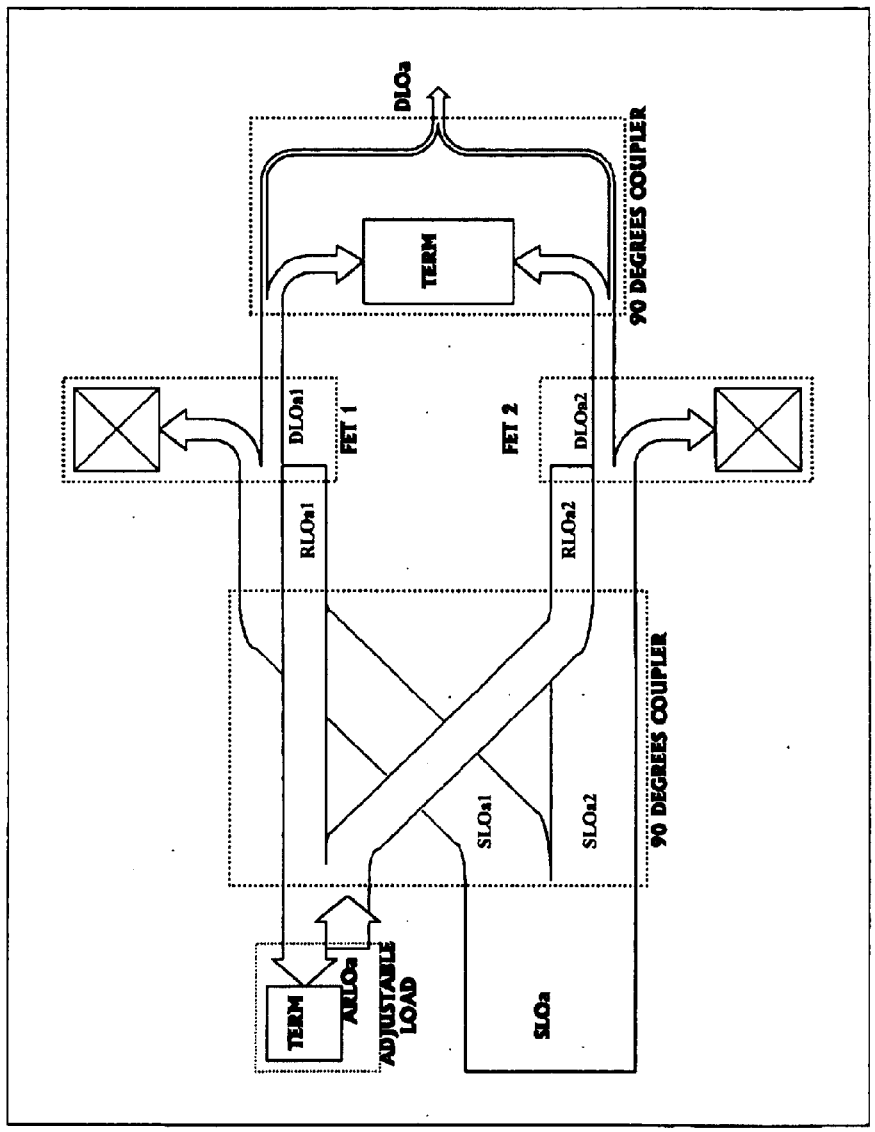
FIGS. 10 and 11 show how the LO is transported through the mixer.
Figure 11:
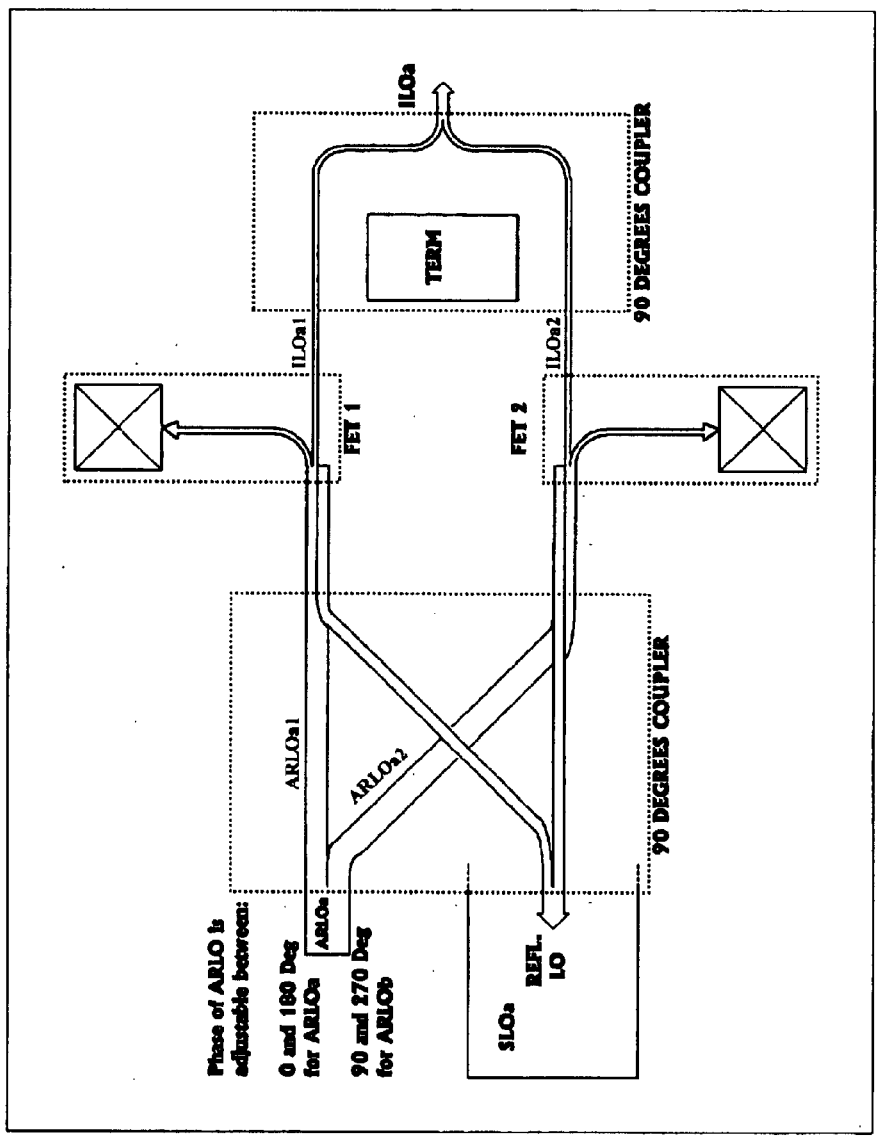

FIGS. 10 and 11 show how the LO is transported through the mixer (see FIG. 3) being partly reflected (RLO), partly leaking through (DLO) and partly absorbed for the mixing process in the transistors. In FIG. 10 the reflected and adjusted signal (ARLO) is shown at the adjustable loads. FIG. 11 shows how the ARLO is transported through the mixer being partly reflected, partly leaking through (ILO) and partly absorbed.

Finally, the performance of the mixer, shown in FIG. 3, is measured over a selected frequency-band as shown in table 1 below, when LO-power is 15 dBm. The gates of the HEMTs are not matched to system-impedance, which implies R=2. The $V_1$, $V_2$, $V_3$ and $V_4$ are set by self-bias through each 10 KΩ resistance to ground. If the circuit was realised in MMIC technology, the good performance could be kept over a broader bandwidth. 90° hybrids are quite suitable to be realised in MMIC technology. The structure described by this novel method and system ensures that the PIN-diodes may easily be mounted outside the chip. If the diodes where replaced by FETs, the complete circuit may be realised by MMIC technology.

TABLE 1

| ILO [GHz] | $P_{RF}$ [dBm] | US [dBc] | LOL [dBm] | $IMD_3$ [dBc] | OIP3 [dBm] | Id1 [mA] | Id2 [mA] |
|---|---|---|---|---|---|---|---|
| 7.45 | −5.4 | −38 | <−70 | −59 | 21 | 0.20 | 0.29 |
| 7.55 | −6.1 | −35 | <−70 | −57 | 19 | 0.18 | 0.27 |
| 7.65 | −5.3 | −36 | <−70 | −61 | 22 | 0.25 | 0.28 |
| 7.75 | −5.4 | −40 | <−70 | −59 | 21 | 0.21 | 0.35 |
| 7.85 | −4.8 | −34 | <−70 | −56 | 20 | 0.20 | 0.30 |
| 7.95 | −4.8 | −35 | <−70 | −59 | 21 | 0.33 | 0.24 |
| 8.05 | −4.8 | −31 | <−70 | −58 | 21 | 0.35 | 0.23 |

Figure 2C:
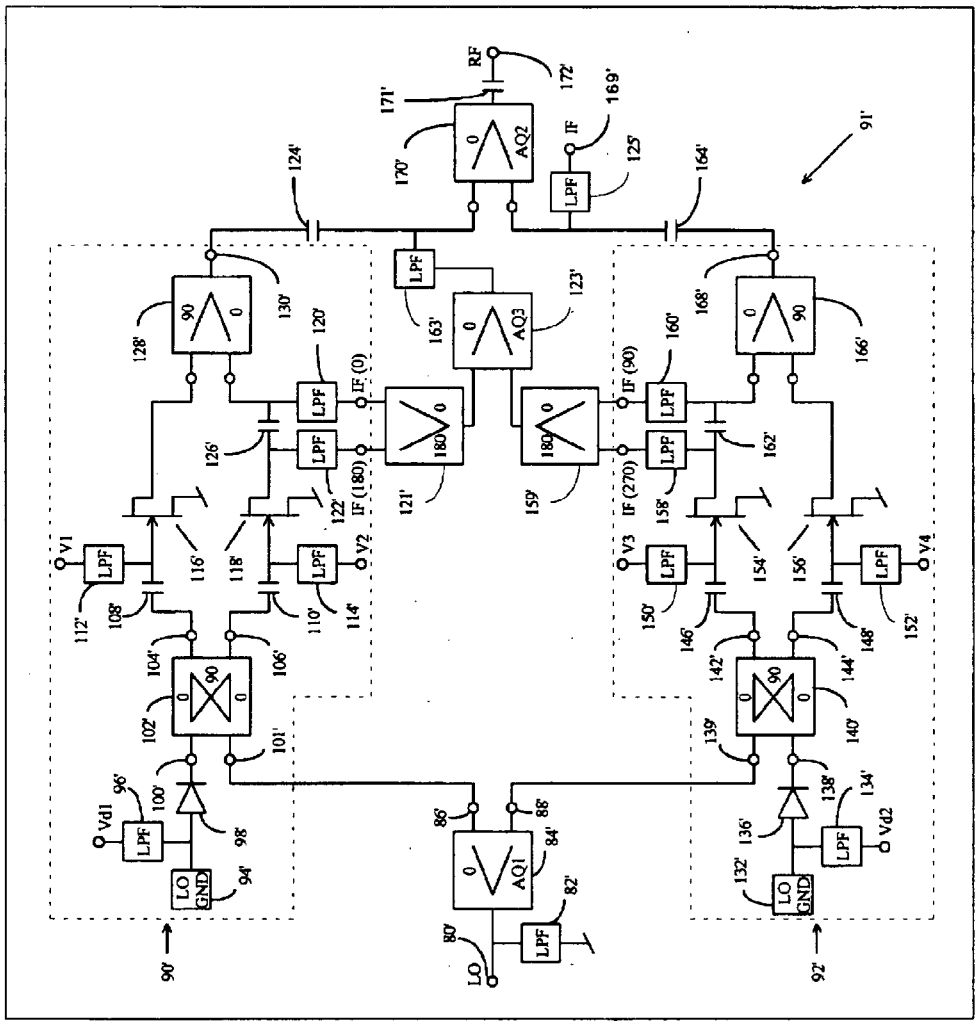
FIG. 2c shows a preferred embodiment of the present invention that prevent crossing IF-lines.

The solution of FIGS. 2b and 2c can be compared with a corresponding diode mixer solution. In M. J. Schindler et al: "A Comparison of GaAs Transistors as Passive Mode Mixers" it is evident that diode mixers typically have OIP3 ("output third order intercept point"—defines how linear they are) of −6 dB to −3 dB relative to the LO-power. The solution according to the present invention has however an OIP3 of over +4 dB relative to the LO-power. It implies that IMD3 (output third order intermodulation) is improved more than 14 dB.

What is claimed is:

1. A mixer comprising a first coupler for receiving and dividing an LO signal into two part-signals in phase displaced relation to each other;

a pair of balanced passive mode transistor mixers electrically connected to said coupler in an image reject coupling relation, one of said transistor mixers having a second coupler for receiving and dividing a respective part signal from said first coupler into two part-signals in phase displaced relation to each other; a pair of transistors, one of said transistors receiving and mixing a respective part signal from said second coupler with an IF(0) to form a first output signal and the other of said transistors receiving and mixing a respective part signal from said second coupler with an IF(180) shifted from said IF(0) in said one transistor to form a second output signal; a third coupler for receiving and adding said output signals from said pair of transistors in phase displaced relation to produce a third output signal; and a tunable load connected to said second coupler for adjusting a signal reflected from said transistors to said second coupler and for reflecting the adjusted signal (ARLO) back through said second coupler to said transistors;

the other of said transistor mixers having a fourth coupler for receiving and dividing a respective part signal from said first coupler into two part-signals in phase displaced relation to each other; a pair of transistors, one of said transistors receiving and mixing a respective part signal from said fourth coupler with an IF(90) to form a first output signal and the other of said transistors receiving and mixing a respective part signal from said fourth coupler with an IF(270) shifted from said IF(90) in said one transistor to form a second output signal; a fifth coupler for receiving and adding said output signals from said pair of transistors in phase displaced relation to produce a third output signal; and a tunable load connected to said fourth coupler for adjusting a signal reflected from said transistors to said fourth coupler and for reflecting the adjusted signal (ARLO) back through said fourth coupler to said transistors; and a sixth coupler for receiving and adding said third output signals from said transistor mixers to form an RF.

2. A mixer as set forth in claim 1 wherein said tunable load in each transistor mixer includes a PIN diode, a virtual ground connected to said diode and a low pass filter connected to said diode for receiving a dc-current.

3. A process for reducing leakage of LO to HF in a real system that converts the frequency of a first signal, which is LO, by mixing the first signal with a second supplied signal SI to a third signal SO of a frequency that is different from the frequency for the first and second signal, wherein the first signal is divided via a number of couplers (84, 102, 140) into a number of part-signals which are phase-displaced relative to each other, and that each such part-signal is led to its respective transistor (116, 118, 154, 156) there being partly absorbed, partly leaking through and partly reflected, and that the part being absorbed by each transistor (116, 118, 154, 156) are mixed with the second signal SI and frequency-shifted, and that the reflected signal from each transistor (116, 118, 154, 156), while being adjusted by a regulating means (98, 136), are transferred back to each transistor (116, 118, 154, 156) where a part thereof leaks through, and that the frequency-shifted part-signals are added to a third signal via a number of couplers (128, 166, 170) 25 after the signals are phase-displaced relative to each other, and that the regulating means (98, 136) are adjusted so that the leakage of LO to RF caused by the reflection and the regulating means (98, 136) cancels the direct leakage of LO to RF so that the total leakage of LO to HF is reduced.

4. A process in accordance with claim 3, wherein the first signal that is supplied the system through a terminal (80) is divided in the coupler (84) into two parts, SLOa and SLO b, that are phase-displaced AQ1 relative to each other, and that each of these part-signals is further divided into two portions that are phase-displaced relative to each other, that is to say SLOa is divided in the coupler (102) to $SLOa_1$ and $SLOa_2$, and SLOb is divided in the coupler (140) to SLOb1 and SLOb2, each of the four signals being led to its respective transistor (116, 118, 154, 156) in passive mode so that $SLOa_1$ is partly reflected ($RLOa_1$), partly absorbed and mixed with the second signal SI $a_1$ (producing SO $a_1$) and partly leaking through (DLO $a_1$), $SLOa_2$ is partly reflected (RLO $a_2$), partly absorbed and mixed with S1 $a_2$ (producing SO $a_2$) and partly leaking through ($DLOa_2$), SLOb1 is partly reflected ($RLOb_1$), partly absorbed and mixed with SI $b_1$ (producing SO $b_1$) and partly leaking through ($DLOb_1$), SLOb2 is partly reflected ($RLOb_2$), partly absorbed and mixed with SI $b_2$ (producing SO $b_2$) and partly leaking through (DLO $b_2$), and that the reflected signals (RLO $a_1$, $RLOa_2$, $RLOb_1$ and $RLOb_2$) are transferred through the couplers (102, 140) to a fourth port (100 and 138) of each coupler (102, 140), and that an adjustable reflected load (98, 136) is coupled to each of these ports (100, 138) and that an adjusted reflected (ARLO) part of the signals at the fourth port of the couplers (102, 140) are reflected back to each transistor (116, 118, 154, 156), and that a part of these adjusted reflection signals (ARLOs) are leaking through each transistor (116, 118, 154, 156), i.e $ILOa_i$, $ILOa_2$, ILO $b_1$ and ILO $b_2$, and if SO is RF and SI is IF, then SOai/$DLOa_1$/ILOai and $S0a_2$/$DLOa_2$/$ILOa_2$ are added in the coupler (128) to SOa/DLOa/ILOa, and that SO $b_1$/DLO $b_1$/ILO $b_1$ and $SOb_2$/DLO $b_2$/ILO $b_2$ are added in the coupler (166) to S0 b/DLOb/ILOb and that SOa/DLOa/ILOa and SOb/DLOb/ILOb are added in the coupler (170) to an SO/DLO/ILO that leaves the system through a terminal (172), and otherwise if SO is IF and SI is RF, then SI is delivered at terminal (172) and the SO is collected by the IF-structure, and that the regulating means (98, 136) being adjusted so that the LO-leakage signal caused by the reflection and the regulating means (98, 136) cancels the direct leakage of LO to RF so that the total leakage of LO to RF is reduced (LLO=DLO−ILO).

5. A process in accordance with any one of claims 3 and 4, wherein said couplers (102, 128, 140, 166) have a phase displacement in the region of 75°–105°.

6. A process in accordance with claim 5 wherein AQ1+AQ2 is in the region of 75°–105°.

7. A process in accordance with claim 5 wherein the second signal SI is an IF-signal and the third signal SO is an RF-signal.

8. A process in accordance with claim 5 wherein the second signal SI is an RF-signal and the third signal SO is an IF-signal.

9. A process in accordance with claim 5 wherein the tunable reflecting load (98) is one of a PIN-diode and the drain-side of a passive mode transistor.

10. A process in accordance with claim 5 wherein the the IF-lines are arranged so that none of these crosses, wherein the signals are fed to the decoupling capacitors (124',I64') which are placed after the couplers (128',I66') to make possible for the two outer filters (I20',IGO') to be placed in the same branches as the two inner filters (122', 158') respectively, so that an IF-structure with couplers (121', 159', 123') may be placed together inside the mixer, while being connected to the outside of the mixer through filters, while utilising couplers (128', 166', 170') that do not attenuate the IF-signal, and that a decoupling capacitor (171') is placed after the coupler (170') to isolate the IF-signal from leaking to the RF-port.

11. A process in accordance with claim 10 wherein the adjustable loads are realised as PIN-diodes (98', 136'), together with virtual grounds (94',I32'), where dc-currents may be connected through low-pass filters (96' 134'), respectively.

12. A process in accordance with claim 5 wherein the couplers 121' and 159' are in the region of 150°–210°.

13. A process in accordance with claim 5 wherein the coupler 123' is in the region of 75°–105° or −105°—75°.

14. A process in accordance with claim 5 wherein an extra length of line is installed in the one IF-connection in each balanced mixer, this maintaining a phase difference of 180° between the two IF-signals by compensating for differences in length of the two branches.

15. A system for reducing the leakage of LO to RF in a real system that converts the frequency of a first signal by mixing the first signal, which is LO, with a second supplied signal SI to a third signal SO of a frequency that is different from the frequency for the first and second signal, wherein the system comprises:

coupler means (84, 102, 140) wherein the first signal is divided into a number of part-signals which are phase-displaced relative to each other, and transistor means (116, 118, 154, 156) whereto each signal is fed, there being partly absorbed, partly leaking through and partly reflected, and that the part being absorbed by each transistor (116, 118, 154, 156) are mixed with the second signal SI and frequency-shifted, and regulation means (98, 136) wherein the reflected signal from each transistor (116, 118, 154, 156) being adjusted (98, 136) and transferred back to each transistor (116, 118, 154, 156) where a part of it is leaking through, and coupler means (128, 166, 170) wherein the frequency-shifted part-signals are added to a third signal, after the signals are phase-displaced relative to each other, and that the regulating means (98, 136) being adjusted so that the leakage of LO to RF caused by the reflection and the regulating means (98, 136) cancels the direct leakage of LO to RF so that the total LO-leakage is reduced.

16. A system in accordance with claim 15 wherein said coupler (84) divides the first signal into two parts that are phase-displaced AQ1 relative to each other, and that said adjustable reflected loads (98, 136) are coupled to the forth port of the couplers (102, 140), in order to adjust the signals reflected from the transistors (116, 118, 154, 156).

17. A system in accordance with claim 15 wherein said couplers 102, 128, 140 and 166 have a phase-displacement in the region of 75°–105°.

18. A system in accordance with claim 15 wherein AQ1+AQ2 is in the region of 75°–105°.

19. A system in accordance with claim 15 wherein the the IF-lines are arranged so that none of these crosses, wherein the signals are fed to the decoupling capacitors (I24', 164') which are placed after the couplers (128', I66') to make possible for the two outer filters (I20', 160') to be placed in the same branches as the two inner filters (122', 158') respectively, so that an IF-structure with couplers (121', 159', 123') may be placed together inside the mixer, while being connected to the outside of the mixer through filters, while utilizing couplers (128', 166', 170') that do not attenuate the IF-signal, and that a decoupling capacitor (171') is placed after the coupler (170') to isolate the IF-signal from leaking to the RF-port.

20. A system in accordance with claim 15 wherein the couplers 121' and 159' are in the region of 150°–210°.

21. A system in accordance with claim 15 wherein the coupler 123' is in the region of 75°–105° or −105°—75°.

22. A system in accordance with claim 15 wherein an extra length of line is installed in the one IF-connection in each balanced mixer, this maintaining the phase difference of 180° between the two IF-signals by compensating for differences in length of the two branches.

23. A system in accordance with claim 15 wherein the tunable reflecting load (98) is one of a PIN-diode and the drain-side of a passive mode transistor.

24. A balanced passive mode transistor mixer (90) comprising two balanced passive mode transistor mixers (90,92) and two couplers (84, 170)

each said mixer having a first (102) and a second (128) coupler, and two transistors (116, 118),wherein the first coupler (102) has two ports (101, 100) at the input and two ports (104, 106) at the output, and wherein the first input port (101) is used as the LO supplying port and the second input port (100) is coupled to a tunable reflecting load (98); and wherein the coupler (84) divides the LO signal supplied to said coupler into two signals phase separated AQ1, and wherein the respective mixers (90,92) which receives said two signals that is led to each of the mixers (90,92) respectively, wherein the supplied LO signal is partly absorbed, partly leaking through and partly reflected, wherein said tunable reflecting loads (98, 136) tunes the reflected signal, and wherein the coupler (170) combines the signals after a phase displacement of AQ2, i.e. the signals directly leaking through said transistors, and the adjusted reflected signal indirectly leaking through said transistors in such a way that the two signals are cancelling each other to provide a suppressed LO-leakage at the RF-port.

25. An image reject balanced mixer (91) in accordance with claim 24 wherein AQ1+AQ2 is in the region of 75°–105°.

26. An image reject balanced mixer (91) in accordance with claim 24 wherein the second signal is an IF-signal and the third signal is an RF-signal.

27. An image reject balanced mixer (91) in accordance with claim 24 wherein the second signal SI is an RF-signal and the third signal 50 is an IF-signal.

28. An image reject balanced mixer (91') in accordance with claim 24 wherein the IF-lines are arranged so that these do not cross each other, wherein decoupling capacitors (124',I64') are placed after the couplers (I28',166') to make possible for the filter (120') to be placed in the same branch as the filter (122'), and the filter (160') in the same branch as the filter (158'), so that an IF-structure with couplers (121', 159', 123') may be placed together inside the mixer, while being connected to the outside of the mixer through filters (163', 125'), while utilising couplers (128', 166', 170') that do not attenuate the IF-signal, and that a decoupling capacitor (171') is placed after the coupler (170') to isolate the IF-signal from leaking to the RF-port.

29. An image reject balanced mixer (91') in accordance with claim 28 wherein an extra length of line is installed in the one IF-connection in each balanced mixer, this maintaining the phase difference of 1800 between the two IF-signals, by compensating for differences in length of the two branches.

30. An image reject balanced mixer (91') in accordance with claim 24 wherein the adjustable loads are realised as PIN-diodes (98', 136'), together with virtual grounds (94', I32'), where dc-currents may be connected through low-pass filters (96',I34'), respectively.

* * * * *